(12) United States Patent
Bala et al.

(10) Patent No.: US 11,051,419 B2
(45) Date of Patent: Jun. 29, 2021

(54) CHASSIS FOR A CIRCUIT ASSEMBLY

(71) Applicant: HEWLETT PACKARD ENTERPRISE DEVELOPMENT LP, Houston, TX (US)

(72) Inventors: Sunil Rao Ganta Papa Rao Bala, Houston, TX (US); Joseph Allen, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/562,681

(22) Filed: Sep. 6, 2019

(65) Prior Publication Data

US 2021/0076524 A1  Mar. 11, 2021

(51) Int. Cl.
| | |
|---|---|
| *H05K 5/06* | (2006.01) |
| *H05K 5/00* | (2006.01) |
| *H05K 5/02* | (2006.01) |
| *G06F 1/18* | (2006.01) |
| *H05K 7/20* | (2006.01) |
| *G06F 1/20* | (2006.01) |
| *H05K 5/03* | (2006.01) |

(52) U.S. Cl.
CPC ............. *H05K 5/069* (2013.01); *G06F 1/182* (2013.01); *G06F 1/20* (2013.01); *H05K 5/0008* (2013.01); *H05K 5/0021* (2013.01); *H05K 5/0247* (2013.01); *H05K 5/03* (2013.01); *H05K 7/20418* (2013.01)

(58) Field of Classification Search
CPC .................................................. H05K 5/0069
See application file for complete search history.

(56) References Cited

U.S. PATENT DOCUMENTS

| | | | |
|---|---|---|---|
| 5,570,270 | A | 10/1996 | Naedel et al. |
| 5,942,728 | A * | 8/1999 | Chen ................ H02B 1/28 174/255 |
| 7,423,216 | B2 | 9/2008 | Pape et al. |
| 7,672,450 | B2 | 3/2010 | Paulsen |
| 9,142,939 | B2 | 9/2015 | Weiss et al. |
| 9,603,269 | B2 | 3/2017 | Omari et al. |
| 2006/0067522 | A1* | 3/2006 | Paulsen ............. H04Q 1/035 379/413.02 |

OTHER PUBLICATIONS

Protocase Inc., "How to Design Enclosures That Protect Against Water and Debris," retrieved online Jun. 21, 2019, https://www.protocase.com/blog/2016/12/09/how-to-design-enclosures-that-protect-against-water-and-debris/.

* cited by examiner

*Primary Examiner* — Hung V Ngo
(74) *Attorney, Agent, or Firm* — Hewlett Packard Enterprise Patent Department

(57) ABSTRACT

Example implementations relate a chassis for a circuit assembly. The chassis includes a chassis body defining an access opening and a volume to house the circuit assembly including a circuit module and an input-output (IO) unit. The chassis body houses the circuit assembly such that the circuit module is enclosed within the volume defined by the chassis body and the IO unit remains accessible for cabling at the access opening. The chassis further includes an IO enclosure attached to the chassis body to seal the access opening from surrounding environment, where the IO enclosure includes a cabling port to allow the cabling to the IO unit.

21 Claims, 7 Drawing Sheets

CHASSIS FOR A CIRCUIT ASSEMBLY

BACKGROUND

In some applications, computing devices may be deployed in a form of chassis in one or more racks or may be deployed in an uncontrolled environments, such as factories, oil rigs, etc. For example, a chassis representing a computing device such as an IoT compute device, a computer, a server, a storage device, a network switch, a wireless communication device/an access point, a wireless range extender, a repeater, a protocol converter, a firewall device, a network gateway, a network address translator, a multiplexer, a network interface controller, a wireless network interface controller, an Integrated Services Digital Network (ISDN) terminal adapter, etc., may provide a physically secure environment for components enclosed therein. Additionally, the chassis may include provisions for mounting the chassis on racks, walls, or metal rails such as "Deutsches Institut für Normung" (DIN) rails, for example. The chassis may also include appropriate input-output ports for interfacing the chassis with external devices and/or systems.

BRIEF DESCRIPTION OF THE DRAWINGS

These and other features, aspects, and advantages of the present specification will become better understood when the following detailed description is read with reference to the accompanying drawings in which like characters represent like parts throughout the drawings, wherein.

Figure 1:
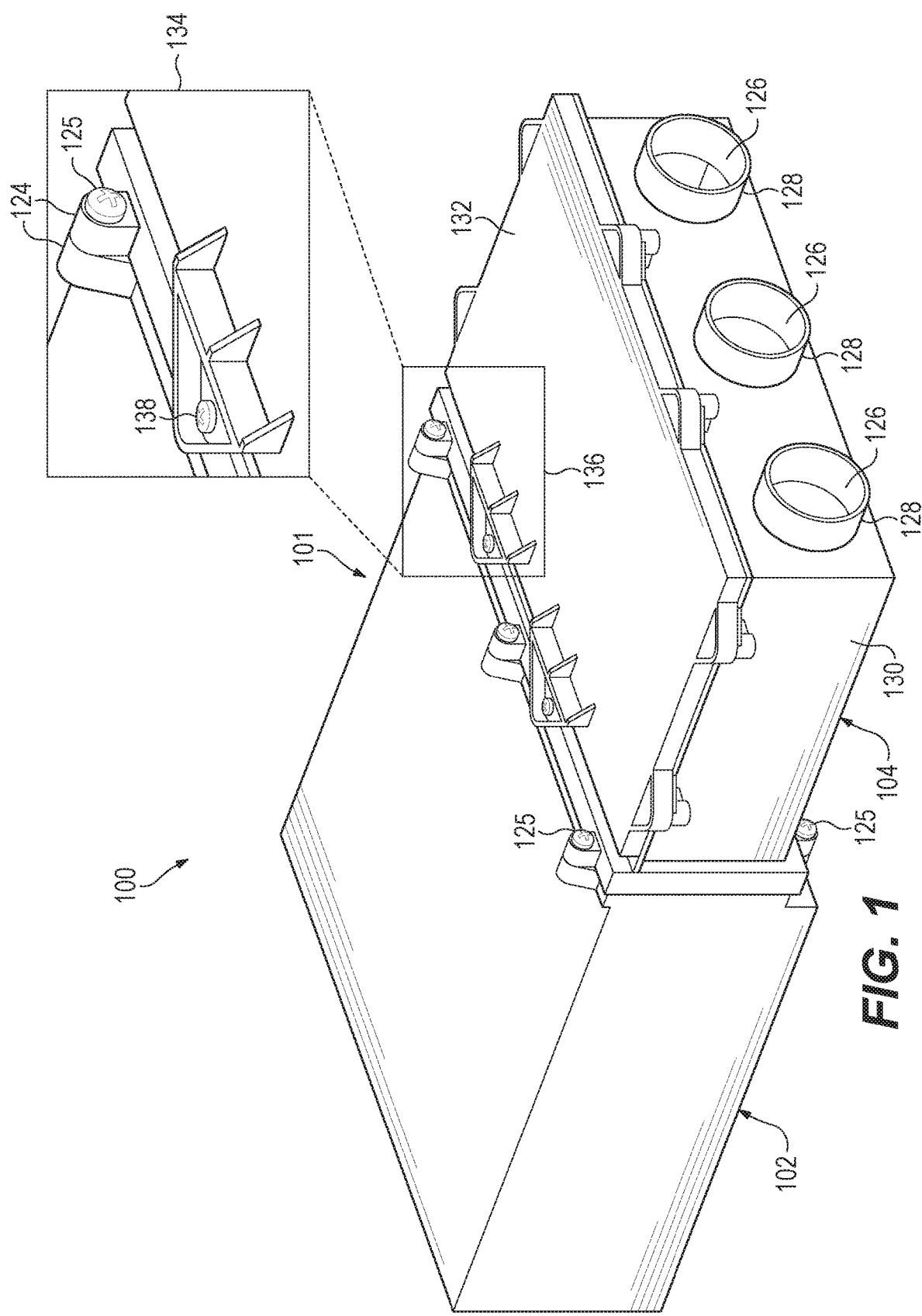
FIG. 1 is a perspective view of a chassis of a computing device, in accordance with one example of the present disclosure.

It is emphasized that, in the drawings, various features are not drawn to scale. In fact, in the drawings, the dimensions of the various features have been arbitrarily increased or reduced for clarity of discussion.

DETAILED DESCRIPTION

The following detailed description refers to the accompanying drawings. Wherever possible, same reference numbers are used in the drawings and the following description to refer to the same or similar parts. It is to be expressly understood that the drawings are for the purpose of illustration and description only. While several examples are described in this document, modifications, adaptations, and other implementations are possible. Accordingly, the following detailed description does not limit disclosed examples. Instead, the proper scope of the disclosed examples may be defined by the appended claims.

The terminology used herein is for the purpose of describing particular examples and is not intended to be limiting. As used herein, the singular forms "a," "an," and "the" are intended to include the plural forms as well, unless the context clearly indicates otherwise. The term "another," as used herein, is defined as at least a second or more. The term "and/or" as used herein refers to and encompasses any and all possible combinations of the associated listed items. As used herein, the term "includes" means includes but not limited to, the term "including" means including but not limited to. The term "based on" means based at least in part on.

A chassis representing a computing device, for example, one or more of an IoT compute device, a computer, a server, a storage device, a network switch, a wireless communication device/an access point, a wireless range extender, a repeater, a protocol converter, a firewall device, a network gateway, a network address translator, a multiplexer, a network interface controller, a wireless network interface controller, an ISDN terminal adapter, etc., may be disposed in various IT infrastructures or may be disposed in an uncontrolled environment. By way of example, compute modules enabling IoT applications may be installed in a variety of environments, such as but not limited to, industrial factory environments, food processing infrastructures, oil rigs, and other indoor and/or outdoor installations. The chassis may be mounted on racks, walls, or metal rails such as DIN rails, for example. These IoT compute devices may provide an effective way to connect and manage operational technology (OT) systems such as control systems, data acquisition systems and industrial networks with the existing information technology (IT) infrastructure. In some examples, the IoT compute devices may have a modular design which allows the device to incorporate expansion modules for a multitude of connectivity options.

In some instances, the environment in which such devices are employed may be harsh, for example, too cold, too hot, humid, or rainy. In some examples, such IoT compute devices may have to face pollutants like smoke, dust, moisture, water, and/or other environmental impurities. Typically, such compute devices are rated to prevent dust ingress, but, are generally not rated for protection against water ingress. In some examples, such compute devices may be installed within a specific type of enclosures, such as, National Electrical Manufacturers Association (NEMA) enclosures. Alternatively, a chassis of these compute devices itself may need to be sufficiently ingress protection (IP) rated. Such a chassis needs to be designed ground-up keeping in mind to use the appropriate IP rated input-output (IO) connector ports. Moreover, in some cases, a new printed circuit assembly (PCA) may need to be designed for a custom application which may not be economical.

In accordance with aspects of the present disclosure, an example chassis for a circuit assembly is presented which provides protection against ingress of various substances including water. The chassis, in accordance with various examples described herein, includes a chassis body defining an access opening and a volume to house the circuit assembly. The circuit assembly may include circuit module and an IO unit. The chassis body houses the circuit assembly such that the circuit module is enclosed within the volume defined by the chassis body and the IO unit remains accessible for cabling at the access opening. The chassis further includes an IO enclosure attached to the chassis body to seal the access opening from surrounding environment, where the IO enclosure includes one or more cabling ports to allow the cabling to the IO unit.

The chassis in accordance with various examples presented herein may be capable of preventing water ingress. Such protection against water ingress may be achieved, at least in part due, to the use of the IO enclosure and a coupling between the IO enclosure and the chassis body. In some instances, a sealant such a gasket may also be placed between the IO enclosure and the chassis body which further enhances a capability of the chassis to prevent water ingress. The features described hereinabove and additional details of the chassis will be described in further detail with reference to accompanying drawings.

Figure 2:
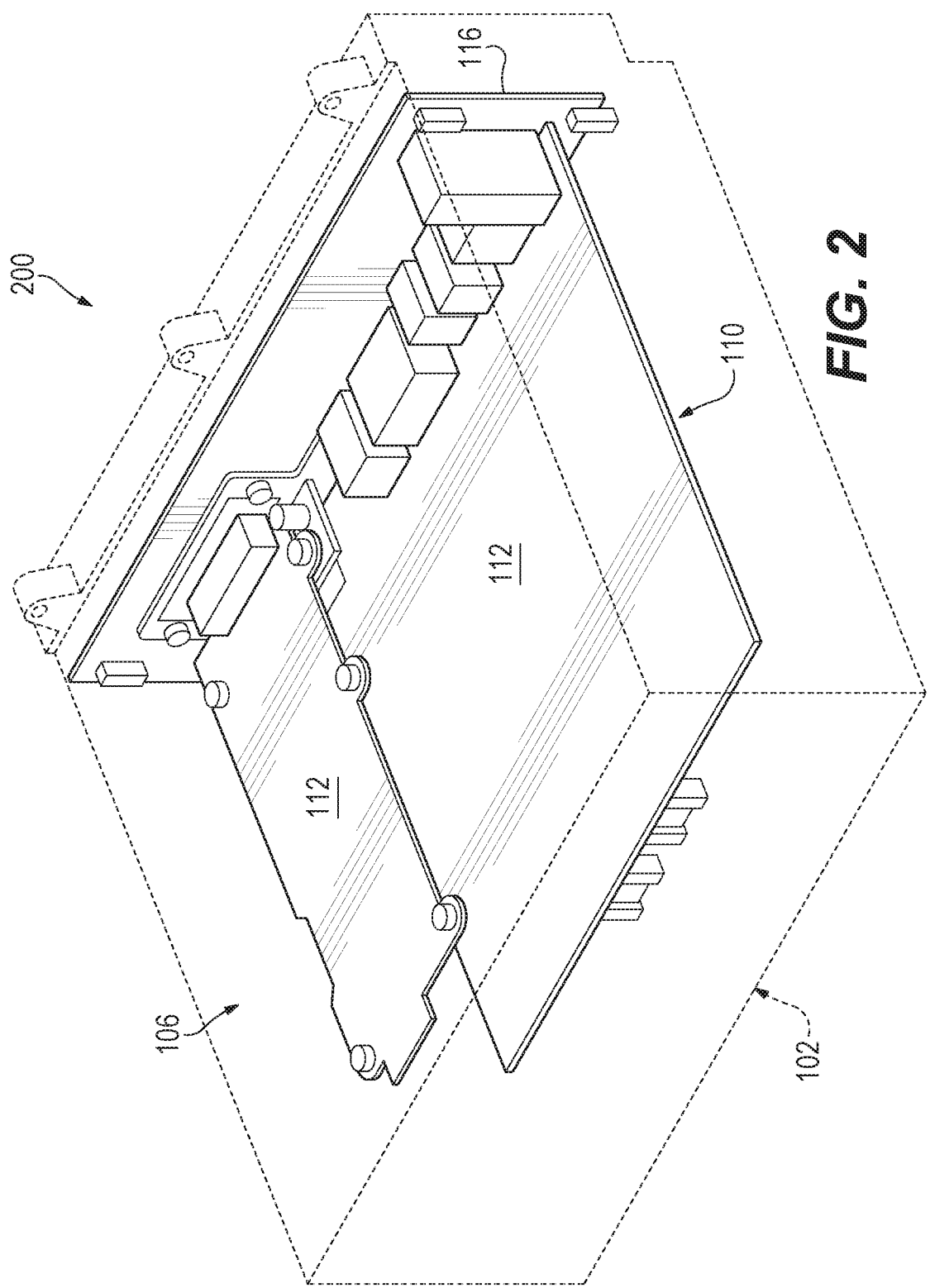
FIG. 2 is a schematic diagram depicting a chassis body of the chassis of FIG. 1, in accordance with one example of the present disclosure.
Figure 3:
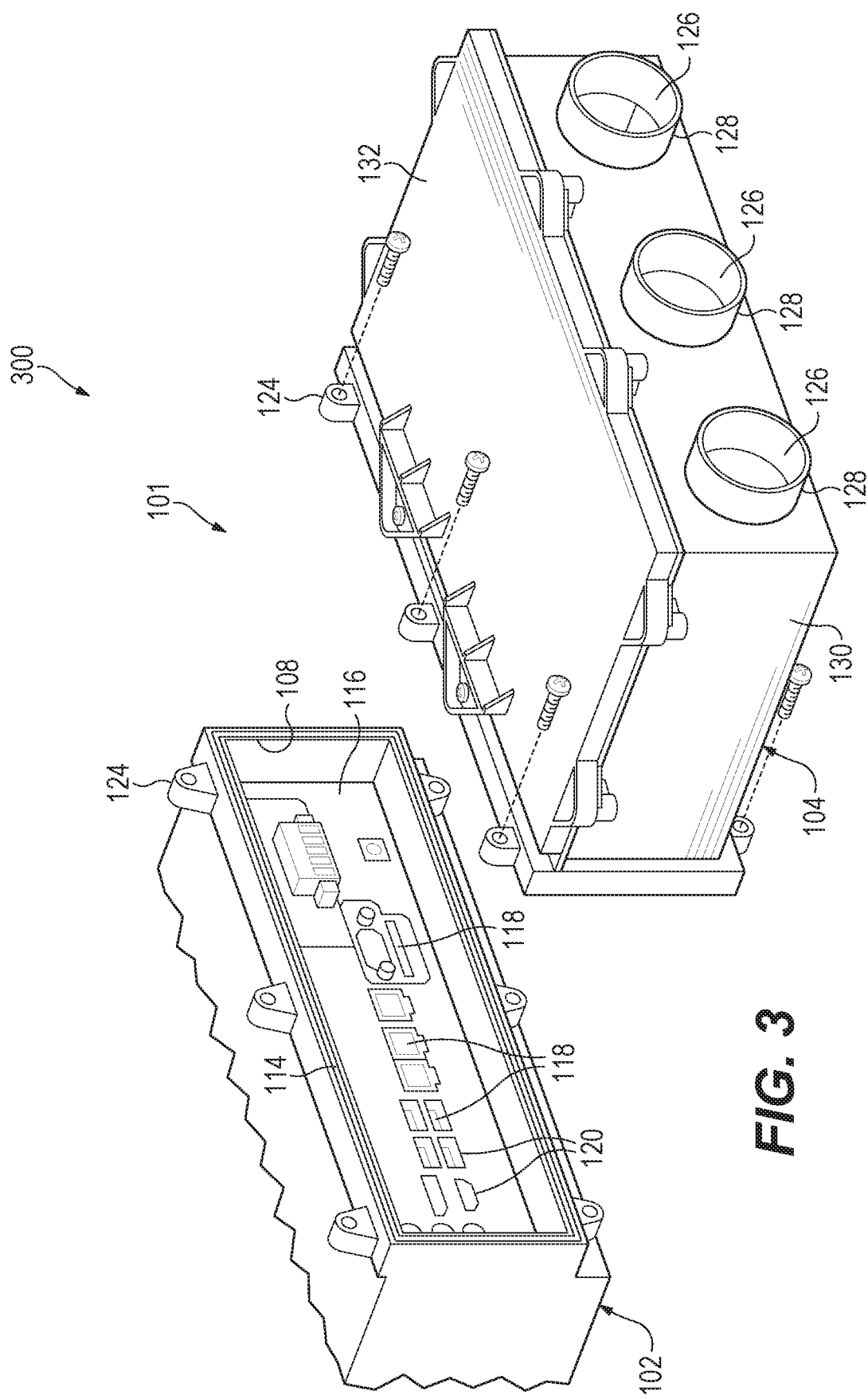
FIG. 3 is a perspective view of the chassis of FIG. 1 shown in an exploded form to depict the chassis body and an input-output (IO) enclosure in a decoupled manner, in accordance with one example of the present disclosure.
Figure 4:
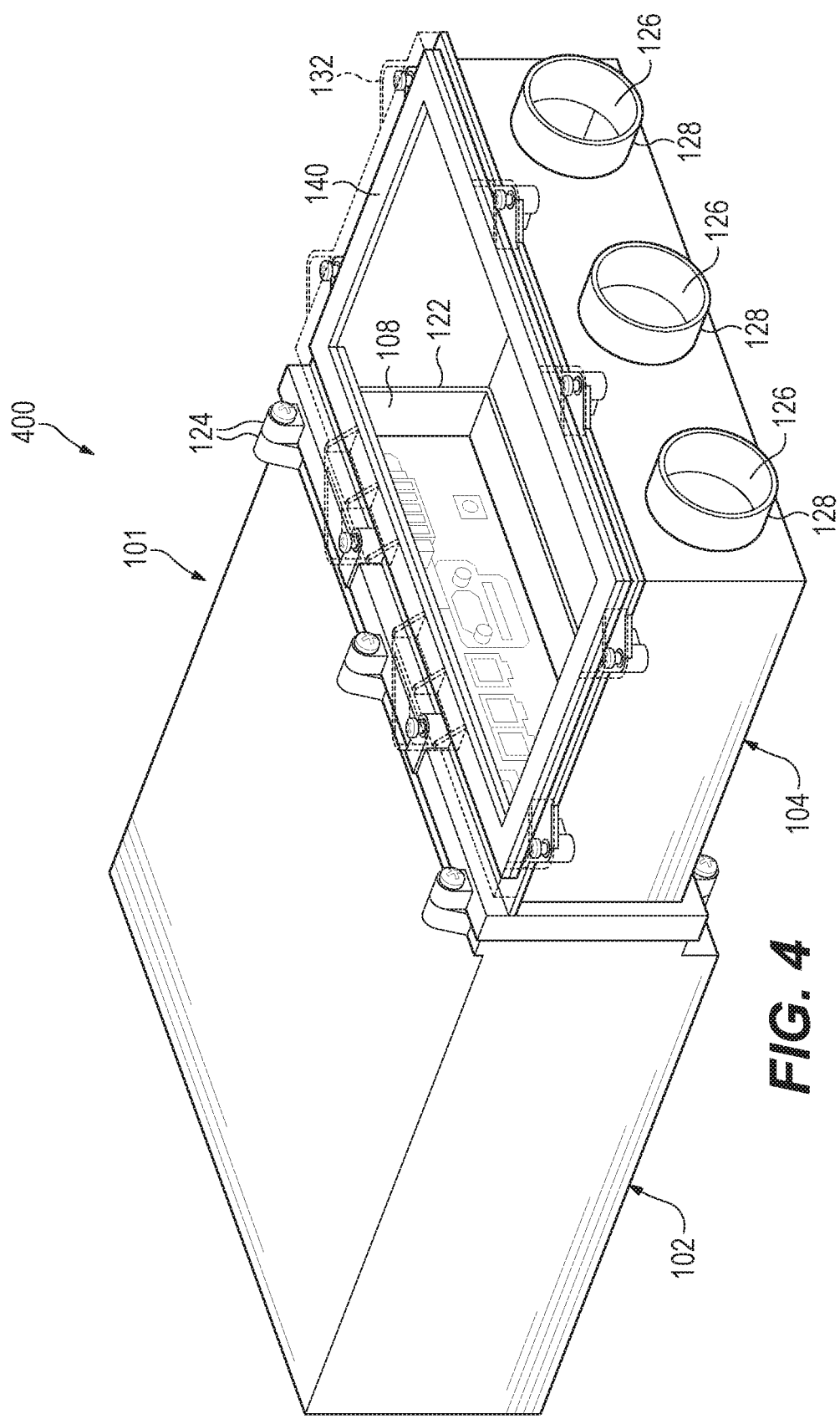
FIG. 4 is another perspective view of the chassis of FIG. 1, in accordance with another example of the present disclosure.

Referring now to drawings, FIG. 1 depicts a perspective view 100 of a chassis 101, in accordance with one example of the present disclosure. The chassis 101 may include a chassis body 102 and an IO enclosure 104. For ease of illustration of various parts of the chassis 101 as shown in FIG. 1 and additional details of such parts, other figures such as FIGS. 2-4 will also be referenced concurrently with FIG. 1. In particular, FIG. 2 represents a schematic diagram 200 depicting the chassis body 102 of the chassis 101 of FIG. 1, in accordance with one example of the present disclosure. Further, FIG. 3 depicts a perspective view 300 of the chassis 101 of FIG. 1 shown in an exploded view to depict the chassis body 102 and the IO enclosure 104 in a decoupled manner, in accordance with one example of the present disclosure. Moreover, FIG. 4 shows another perspective view 400 of the chassis 101 of FIG. 1, in accordance with another example of the present disclosure.

By way of example, the chassis 101 may represent a computing device such as, but not limited to, an IoT compute device, a computer, a server, a storage device, a network switch, a wireless communication device/an access point, a wireless range extender, a repeater, a protocol converter, a firewall device, a network gateway, a network address translator, a multiplexer, a network interface controller, a wireless network interface controller, an ISDN terminal adapter, etc. In the description hereinafter, for illustrative purposes, the chassis 101 is shown to represent the IoT compute device without limiting the scope of the present disclosure. In some implementations, the IoT compute device as represented by the chassis 101 may provide an effective way to connect and manage operational technology (OT) systems such as control systems, data acquisition systems and industrial networks with the existing information technology (IT) infrastructure. The IoT compute device as represented by the chassis 101 may have a modular design which allows the device to incorporate expansion modules for a multitude of connectivity options.

By way of example, as depicted in FIGS. 1-4, the chassis body 102 is shown to have a rectangular box shape, although the present disclosure is not limited with respect to a shape of the chassis body 102. The chassis body 102 may define a volume 106 (see FIG. 2) and an access opening 108 (see FIG. 3). The volume 106 may be defined by walls of the chassis body 102. In particular, the volume 106 may represent a space enclosed by the walls of the chassis body 102 in which a circuit assembly 110 may be disposed. Further, the access opening 108 may be defined by an absence of a side wall of the chassis body 102 or by cutting a portion of one or more sides of the chassis body 102. For illustrative purposes, the access opening 108 as shown in various figures of the present disclosure, including FIGS. 1-4, has a rectangular shape. It may be noted that the access opening 108 having a different shape (e.g., a circular, square, elliptical, etc.) may also be formed in the chassis body 102.

The circuit assembly 110 (see FIG. 2) represents electronic circuits that may perform functions for an intended use of the chassis 101. In the present case, the circuit assembly 110 may represent electronic circuits that may perform various functions intended for an IoT infrastructure, for example. The circuit assembly 110 may include one or more circuit modules 112.

The circuit modules 112 may include one or more of processing resources, electronic storage, power supply and power management modules, remote management modules, or wireless communication modules. The processing resource may include a microcontroller, a microprocessor, central processing unit core(s), an application-specific integrated circuit (ASIC), a field programmable gate array (FPGA), etc. Additionally or alternatively, the processing resource may include electronic circuitry for performing the functionality for the intended use of the chassis 101. The electronic storage may include a non-transitory machine readable medium. Examples of the non-transitory machine readable medium may include, but are not limited to, a random access memory (RAM), a read-only memory (ROM), an electrically erasable programmable read-only memory (EEPROM), a flash memory, a hard disk drive, etc. The non-transitory machine readable medium may be accessed by the processing resource and may be encoded with program instructions for the processing resource perform functions for the intended use of the chassis 101. Further, the power supply and power management modules may include AC or DC input modules (e.g., 9-36 volts DC input, 12 volts DC inputs), and/or power transfer board. The remote management modules may allow controlling and monitoring of the circuit assembly 110 from a remote location. The remote management modules may be used to configure, update, monitor, and run servers remotely. Furthermore, the wireless communication modules may be implemented using technologies such as Wi-Fi, Bluetooth, cellular communication techniques, and the like.

The circuit assembly 110 may further include one or more IO units 118. The IO units 118 may include one or more ports which may be used to interface the circuit modules 112 of the circuit assembly 110 with external devices and/or systems (not shown) at the access opening 108. Moreover, the IO units 118 may include audio/visual indicators. In some examples, the IO units 118 may be electrically coupled to the circuit modules 112. The IO units 118 may include audio ports, a display port, Ethernet ports, a serial communication port, a DC input power port, an LED display panel, a power on-off switch, a CPU reset switch, a memory card slot, a management Ethernet port, USB ports, an HDMI port, or combinations thereof. It may be noted that other types of ports and/or indicators may also be used in the circuit assembly 110. Further, the circuit assembly 110 having any number of IO units 118 may be employed without limiting the scope of the present application. Moreover, these IO units 118 may be arranged in any suitable layout as desired by a specific implementation/application.

In some examples, the chassis body 102 may include a faceplate 116. The faceplate 116 may be disposed at the access opening 108 and may include one or more cut-outs 120. In some examples, the faceplate 116 may be attached to the chassis body 102 via adhesive(s) and/or fasteners such as, but not limited to, one or more screws, clamps, or combinations thereof (not shown). Although in the examples presented herein, the faceplate 116 is shown as a separate element from the chassis body 102, in certain other examples, the faceplate 116 may be integral part of the chassis body 102 and the chassis body may include cut-outs such as the cut-outs 120. It may be noted that the access opening 108 may be defined collectively by the cut-outs 120.

The circuit assembly 110 may be disposed in the chassis body 102. In particular, the circuit modules 112 of the circuit assembly 110 may be disposed inside the volume 106 defined by the chassis body 102. In some examples, the chassis body 102 may include one or more mounting provisions (e.g., posts—not shown) inside the volume 106 to facilitate positioning and mounting of the circuit modules 112 within the volume 106. The mounting provisions may be fixed to one or more walls of the chassis body 102. The circuit modules 112 may be mounted inside the volume 106 via one or more screws, for example, at the one or more mounting provisions/posts. In accordance with some aspects of the present disclosure, the chassis body 102 houses the circuit assembly 110 such that the one or more circuit modules 112 are enclosed within the volume 106 defined by the chassis body 102 and the IO units 118 remains accessible for cabling at the access opening 108 (see FIGS. 2-4). In particular, the circuit assembly 110 may be disposed in the chassis body 102 such that the circuit modules 112 of the circuit assembly 110 are positioned inside the volume 106 while the IO units 118 face the access opening 108. Further, in examples where the faceplate 116 is used, the cut-outs 120 in the faceplate 116 are formed/designed in accordance with arrangement of the IO units 118 so that the IO units 118 are accessible via the cut-outs 120.

Further, in accordance with aspects of the present disclosure, the IO enclosure 104 may be attached to the chassis body 102 to seal the access opening 108 from surrounding environment. In some implementations, the IO enclosure 104 may be attached to the chassis body 102 such that a watertight seal is formed between the IO enclosure 104 and the chassis body 102. One or both of the chassis body 102 and the IO enclosure 104 may include one or more provisions to facilitate attachment of the IO enclosure 104 with the chassis body 102. For example, such provisions may include posts 124 to facilitate screwing and clamp mountings (not shown), or a combinations thereof. To enable the watertight seal between the IO enclosure 104 and the chassis body 102, the IO enclosure 104 may be tightly attached to the chassis body 102 via the provisions (e.g., posts 124) using, fasteners such as screws, clamps, pins, or combinations thereof, for example. Additionally or alternatively, adhesives may also be used to attach the IO enclosure 104 to the chassis body 102. In the presently contemplated example, the IO enclosure 104 is shown as attached to the chassis body 102 via one or more screws 125.

Furthermore, in some implementations, a sealant 122 (see FIG. 4) may be disposed along the perimeter of access opening 108 to further enhance the watertight seal between the IO enclosure 104 and the chassis body 102 at the access opening 108. By way of example, the sealant 122 may be a gasket. Another suitable examples of the sealant 122 may include, but are not limited to, rubber, silicone, neoprene, or combinations thereof.

Moreover, the IO enclosure 104 may further include one or more cabling ports 126 to allow cabling to the IO units 118. The cabling ports 126 may be formed as holes in the IO enclosure 104 which allow passage of cables (not shown). In the presently contemplated examples, the IO enclosure 104 is shown to have three cabling parts 126 for illustrative purposes. It may be noted that the IO enclosure 104 may have greater than three or fewer than three cablings ports 126. Further, in the examples shown herein, the cabling ports 126 are shown to have cylindrical wall 128. In certain examples, the cabling ports 126 may not have such cylindrical wall.

In some implementations, the IO enclosure 104 may have a unibody construction (i.e., formed as single piece structure). However, in some implementations, as shown in various figures, the IO enclosure 104 may have more than one parts. For example, as shown in FIG. 1, the IO enclosure 104 may include an enclosure body 130 and a cover 132. The cover 132 may be removably attached to the enclosure body 130. In particular, when the IO enclosure 104 is attached to the chassis body 102, the cover 132 may provide an access to the IO units 118 for cabling when detached from the enclosure body 130. Once the cabling is completed, the cover 132 may be attached back to the enclosure body 130.

The cover 132 may be removably attached to the enclosure body 130 via various fastening techniques such that a watertight seal is formed between the enclosure body 130 and the cover 132. More particularly, the cover 132 may be attached to the enclosure body 130 via one or more fasteners, adhesive, or a combination thereof. For example, as depicted in an enlarged view 134 of a portion 136 (see FIG. 1) of the chassis 101, the cover 132 may be attached to the enclosure body 130 via one or more screws 138. In some other examples, the cover 132 may be attached to the enclosure body 130 via fasteners such as the screws 138, clamps, pins, adhesives, or combinations thereof. In certain implementations, a sealant 140 (see FIG. 4) may be disposed along a contact between the enclosure body 130 and the cover 132 to further enhance the watertight seal between the enclosure body 130 and the cover 132. By way of example, the sealant 140 may be a gasket. Another suitable examples of the sealant 140 may include, but are not limited to, rubber, silicone, neoprene, or combinations thereof.

Figure 5:
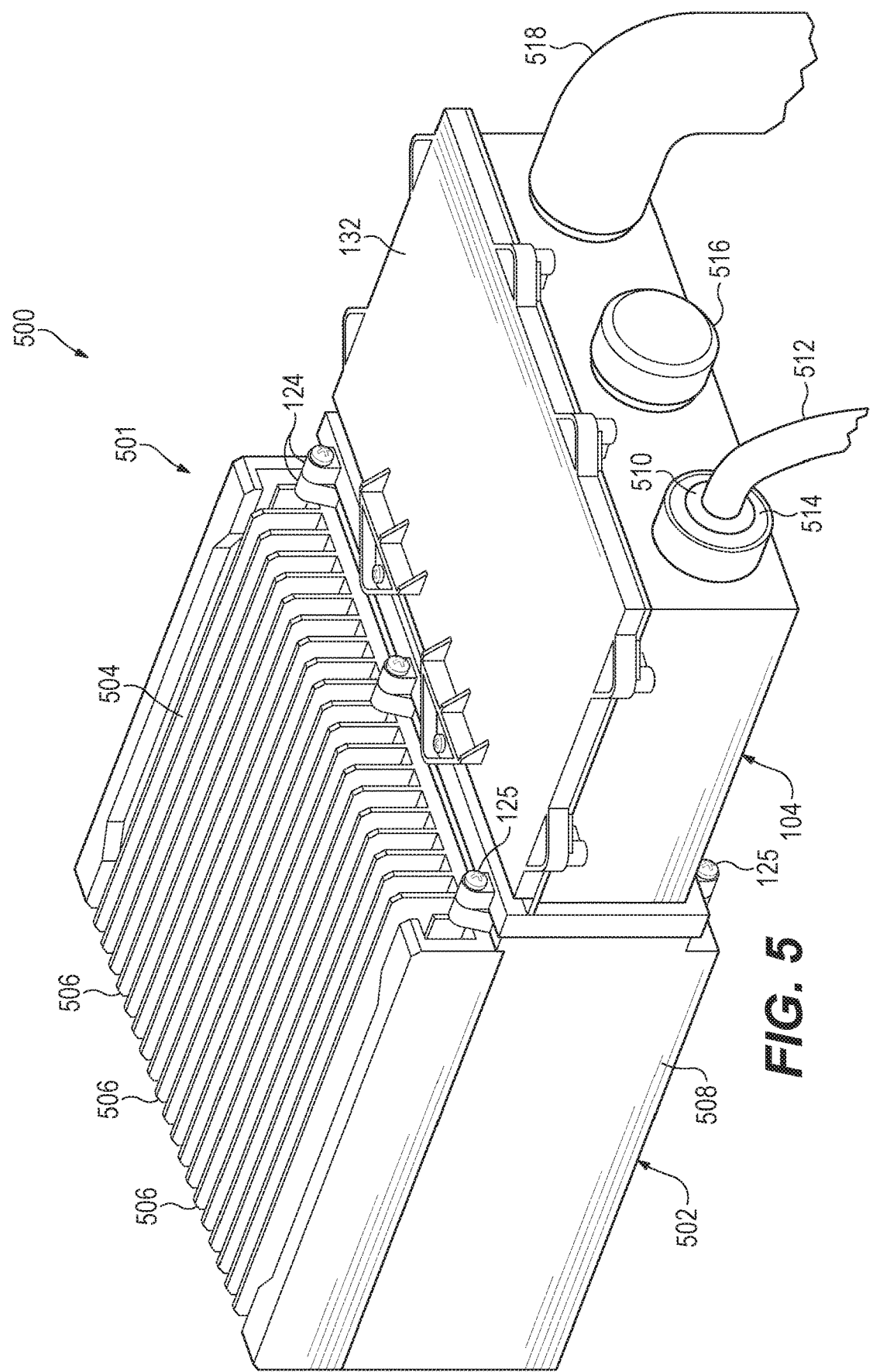
FIG. 5 is a perspective view of a chassis, in accordance with another example of the present disclosure.

Referring now to FIG. 5, a perspective view 500 of a chassis 501 is presented, in accordance with another example of the present disclosure. The chassis 501 depicted in FIG. 5 represents one example of the chassis 101 shown in FIG. 1 and include various parts that are similar to those described earlier using the same reference numerals. Description of which is not repeated herein. In comparison to the chassis 101 of FIG. 1, the chassis 501 of FIG. 5 is shown to include a chassis body 502 having a heat sink 504. The heat sink 504 may have one or more fins 506 that allow transfer of heat generated by the circuit modules 112 (not visible in FIG. 5) to surroundings via a flow of air through gaps between the fins 506. The heat sink 504 may be thermally coupled to the circuit modules 112 via a heat spreader (not shown). Further, the heat sink 504 may be attached to side walls 508 (side wall 508 is visible in FIG. 4) of the chassis body 502 to form a watertight seal therebetween. By way of example, the heat sink 504 may be attached to side walls 508 using screws, clamps, pins, adhesives, or combinations thereof, such that a watertight seal is formed along a contact between the heat sink 504 and top edges of the side walls 508 of the chassis body 502.

Further, in certain implementations, one or more of the cabling ports 126 may include a cabling gland 510 to facilitate sealed positioning of one or more cables 512 therethrough. The cabling gland 510 may be removably disposed in the cabling ports 126. By way of example, cabling port 126 is shown to have the cabling gland 510 disposed therein. The cabling gland 510 may also be disposed in one or more other cabling ports 126, as well. In some implementations, a sealant 514 may be disposed between the wall of the cabling port 126 and the cabling gland 510 to block a passage of water therethrough. An example of one such sealant 514 may a rubber ring. Other types of sealants may also be used as the sealant 514. Moreover, a size (e.g., inner diameter) of the cabling gland 510 may be selected depending in an outer diameter of the cable 512 to be inserted therethrough. More particularly, the size of the cabling gland 510 may be selected such that once the cable 512 is inserted through the cabling gland 510, the cable 512 may be secured in the cabling gland 510 in a watertight manner, thereby blocking passage of water via the cabling gland 510.

Additionally, in some implementations, any unused cabling port 126 (e.g., the middle cabling port) may be blocked via one or more caps, such as, a cap 516, to prevent a passage of water inside the IO enclosure 104. The cap 516 may be snap-fitted on the cabling port 126. In some other examples, the cap 516 may be screwed on the wall of the cabling port 126. In such case, suitable threads may be formed on the wall of the cabling port 126.

Moreover, in some implementations, a conduit 518 may be attached to the cabling port 126 to allow a secure passage of a cable (not shown) therethrough. In some instances, the conduit 518 may be fitted on the cabling port 126. In some examples, the conduit 518 may be secured onto the cabling port via a fastener (not shown), such as, but not limited to, pressure clips, rubber bands, screws, clamps, and the like. A length of such conduit 518 may be selected depending on a length of the cable passing therethrough, application environment of the chassis 501, and/or protection requirement of the cable. In certain examples, the conduit 518 may be coated via suitable materials or layers to prevent protection from water and/or fire. In the example presented in FIG. 4, the IO enclosure 104 is shown to have all three types of features—cabling gland 510, the cap 516, and conduit 518, for illustrative purpose only. Depending on the implementation and connections of the chassis 501, fewer or greater number of such features may be employed, without limiting the scope of the present application.

Figure 6:
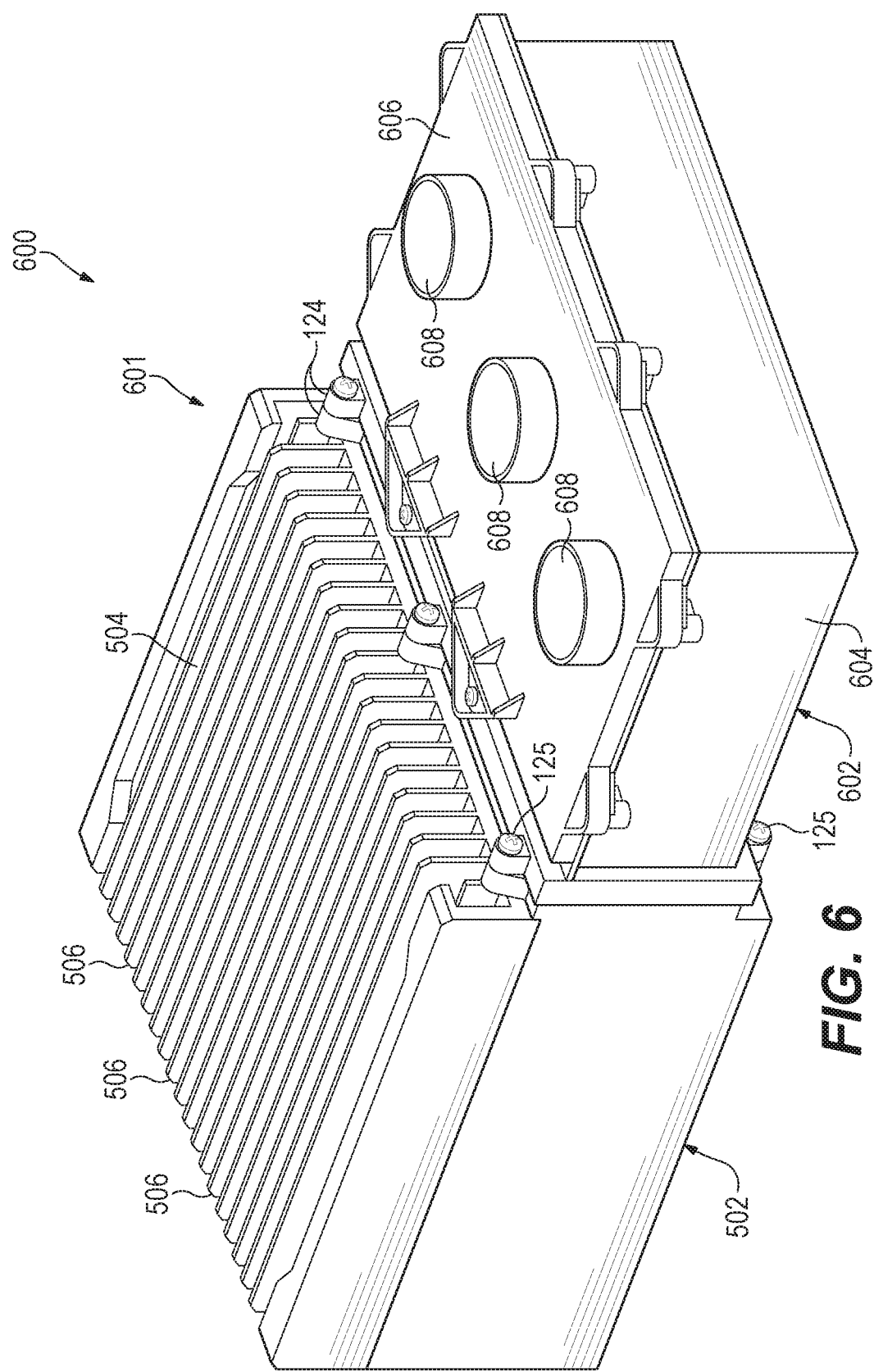
FIG. 6 is a perspective view of a chassis, in accordance with yet another example of the present disclosure.

Turning now to FIG. 6, a perspective view 600 of a chassis 601 is presented, in accordance with another example of the present disclosure. The chassis 601 depicted in FIG. 6 represents one example of the chassis 501 shown in FIG. 5 and include various parts that are similar to those described earlier using the same reference numerals. Especially, in FIG. 6, features such as the cabling gland 510, the cap 516 and the conduit 518 are not shown, however, they may or may not be present. Further, in comparison to FIG. 4, the chassis 601 includes a different IO enclosure 602. In particular, the IO enclosure 602 includes an enclosure body 604 and a cover 606, where the cover 606 may include one or more cabling ports 608 as opposed to the cabling ports 126 that are formed in the enclosure body 130 in FIG. 4. Use of the cabling ports 608 may remain as that of the cabling ports 126. In certain other implementations, although not depicted, both of the enclosure body 604 and the cover 606 may include one or more cabling ports, such as, the cabling ports 126, 608.

Figure 7:
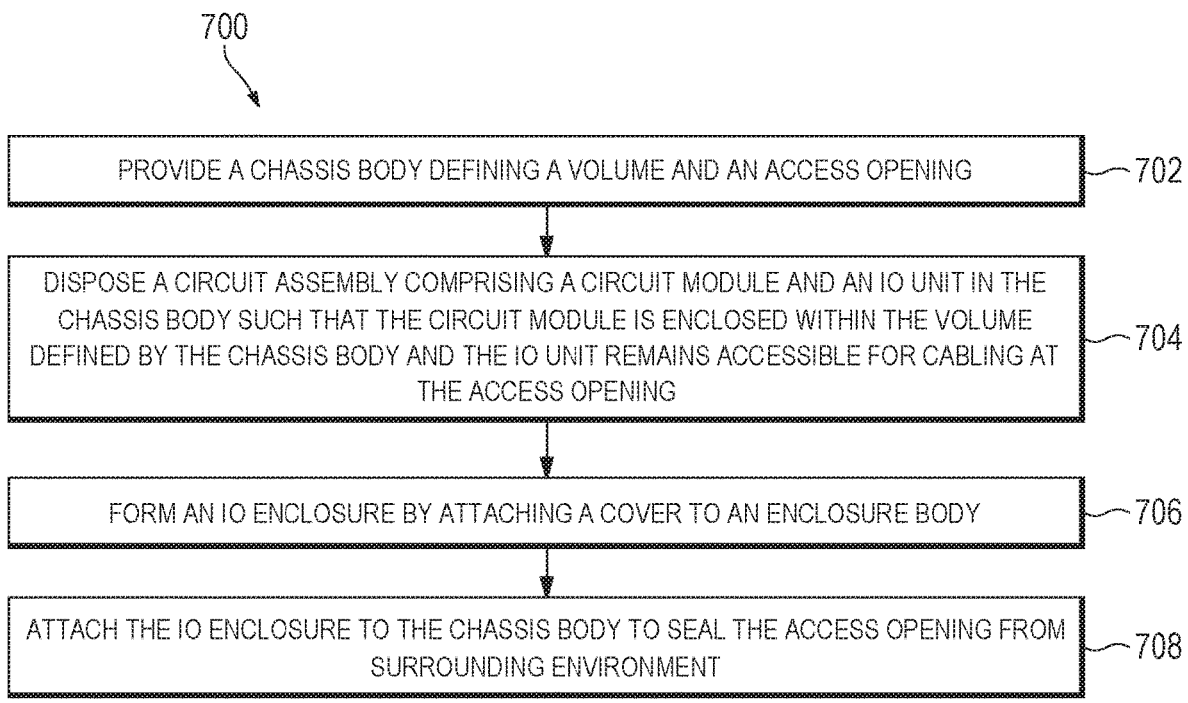
FIG. 7 is a flow diagram of an example method for assembling a chassis, in accordance with one example of the present disclosure.

Moving now to FIG. 7, a flow diagram of an example method 700 for assembling a chassis, such as the chassis 101, 501, 601, is presented, in accordance with one example of the present disclosure. In discussing FIG. 7, reference is made to the chassis 101 of FIG. 1 to provide contextual examples. Implementation, however, is not limited to those examples. In some implementations, one or more blocks of these example method may be executed substantially concurrently or in a different order than shown. In some implementations, a method may include more or fewer blocks than are shown. In some implementations, one or more of the blocks of these example methods may, at certain times, be ongoing and/or may repeat.

At block 702, a chassis body, such as, the chassis body 102 may be provided. As previously noted, the chassis body 102 may include the volume 106 and the access opening 108. Further, at block 704, a circuit assembly, such as, circuit assembly 110 including the one or more circuit modules 112 and the IO units 118 may be disposed in the chassis body 102 such that the one or more circuit modules 112 of the circuit assembly 110 are enclosed within the volume 106 defined by the chassis body 102 and the IO units 118 remains accessible for cabling at the access opening 108. In particular, the circuit assembly 110 may be disposed in the chassis body 102 such that the circuit modules 112 of the circuit assembly 110 are positioned inside the volume 106 while the IO units 118 faces the access opening 108.

Furthermore, at block 706, the method 700 may also include forming the IO enclosure 104 by attaching the cover 132 to the enclosure body 130. The cover 132 when detached from the enclosure, facilitates an access to the IO units 118 for the cabling. As previously noted, the cover 132 may be attached to the enclosure body 130 via one or more of the screws, hinges, clamps, pins, or adhesives.

Moreover, at block 708, the IO enclosure 104 may be attached to the chassis body 102 to seal the access opening 108 from surrounding environment. Further, in accordance with aspects of the present disclosure, the IO enclosure 104 may be attached to the chassis body 102 such that a watertight seal is formed between the IO enclosure 104 and the chassis body 102. The IO enclosure 104 may be attached to the chassis body 102 via one or more of the screws, clamps, pins, or adhesives. In some cases, a sealant, such as the sealant 122, may be disposed between the IO enclosure 104 and the chassis body 102 along the contact surface thereof.

The chassis 101, 501, and/or 601, in accordance with various examples presented herein, are rated for protection against water ingress. Such protection against water ingress may be achieved, at least in part due, to the coupling between the IO enclosure 104, 602 and the chassis body 102, 502. In some instances, the sealant 122 such a gasket may also be placed between the IO enclosure 104, 602 and the chassis body 102, 502 which further enhances a capability of preventing water ingress by the chassis 101, 501, and/or 601. Further, a watertight seal/coupling between the enclosure body 130, 604 and the cover 132, 606 may additionally prevent any water ingress via the contact there-between. In fact, in some examples, the sealant 140 (e.g., gasket) disposed between the enclosure body 130, 604 and the cover 132, 606 may further enhances the capability of preventing water ingress. Additionally, used of various features such as the cabling gland 510, the cap 516 and the conduit 518 may also enhance the capability of preventing water ingress by the chassis 101, 501, and/or 601. Also, the chassis 101, 501, and/or 601, in accordance with various examples presented herein, may represent a cost effective solution for preventing water ingress without redesigning the circuit assembly.

In the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. A chassis for a circuit assembly, comprising:
a chassis body defining an access opening and a volume to house the circuit assembly comprising a circuit module and an input-output (IO) unit, wherein the chassis body houses the circuit assembly such that the circuit module is enclosed within the volume defined by the chassis body and the IO unit is disposed at the access opening of the chassis body and facing the access opening for cabling; and
an IO enclosure attached to the chassis body to seal the access opening from surrounding environment, wherein the IO enclosure comprises a cabling port to allow the cabling to the IO unit, and wherein the chassis body and the IO enclosure comprise one or more mounting posts at the access opening to facilitate attachment and watertight seal between the IO enclosure and the chassis body.

2. The chassis of claim 1, further comprising a sealant disposed along a contact between the IO enclosure and the chassis body.

3. The chassis of claim 1, wherein the IO enclosure further comprises a cabling gland disposed in the cabling port to facilitate a sealed positioning of a cable in the cabling port.

4. The chassis of claim 1, wherein the IO enclosure further comprises a conduit coupled to the cabling port to allow passage of a cable therethrough.

5. The chassis of claim 1, wherein the IO enclosure further comprises:
an enclosure body; and
a cover removably attached to the enclosure body, wherein the cover, when detached from the enclosure, facilitates an access to the IO unit for the cabling.

6. The chassis of claim 5, wherein the IO enclosure further comprises a sealant disposed along a contact between the enclosure body and the cover.

7. The chassis of claim 5, wherein the cover is attached to the enclosure body via one or more fasteners, adhesive, or a combination thereof.

8. The chassis of claim 1, wherein the chassis body further comprises a heat sink.

9. The chassis of claim 1, further comprising a faceplate disposed at the access opening and coupled to the chassis body, wherein the faceplate comprises one or more cut-outs formed in accordance with an arrangement of one or more ports of the IO unit, wherein the one or more ports are accessible for cabling through the one or more cut-outs.

10. The chassis of claim 1, wherein the IO enclosure is attached to the chassis body by fastening one or more screws via the one or more mounting posts.

11. A chassis, comprising:
a circuit assembly comprising a circuit module and an input-output (IO) unit;
a chassis body defining an access opening and a volume, wherein the circuit assembly is disposed such that the circuit module is enclosed within the volume defined by the chassis body and the IO unit is disposed at the access opening of the chassis body and facing the access opening for cabling;
an IO enclosure attached to the chassis body to form a waterproof seal around the access opening, wherein the IO enclosure comprises a cabling port to allow the cabling to the IO unit, and wherein the chassis body and the IO enclosure comprise one or more mounting posts at the access opening to facilitate attachment and watertight seal between the IO enclosure and the chassis body; and
a gasket disposed along a contact between the IO enclosure and the chassis body.

12. The chassis of claim 11, wherein the IO enclosure is attached to the chassis body by fastening one or more screws via the one or more mounting posts.

13. The chassis of claim 11, wherein the IO enclosure further comprises a sealant disposed between an inner surface of the cabling port and the cabling disposed therein.

14. The chassis claim 11, wherein the IO enclosure further comprises a conduit coupled to the cabling port to allow passage of a cable therethrough.

15. The chassis of claim 11, wherein the IO enclosure further comprises a port cover, wherein the port cover is used to seal the cabling port.

16. The chassis of claim 11, wherein the IO enclosure comprises:
an enclosure body; and
a cover removably attached to the enclosure body via one or more screws, wherein the cover, when detached from the enclosure, facilitates an access to the IO unit for the cabling.

17. The chassis of claim 16, wherein the IO enclosure further comprises a gasket disposed along a contact between the enclosure body and the cover.

18. The chassis of claim 16, wherein the cabling port comprises a first cabling port formed in the enclosure body, a second cabling port formed in the cover, or both.

19. A method, comprising:
providing a chassis body defining a volume and an access opening;
disposing a circuit assembly comprising a circuit module and an input-output (IO) unit in the chassis body such that the circuit module is enclosed within the volume defined by the chassis body and the IO unit is disposed at the access opening of the chassis body and facing the access opening for cabling; and
attaching an IO enclosure to the chassis body to seal the access opening from surrounding environment, wherein the chassis body and the IO enclosure comprise one or more mounting posts at the access opening to facilitate attachment and watertight seal between the IO enclosure and the chassis body, and wherein the IO enclosure comprises a cabling port to allow the cabling to the IO unit.

20. The method of claim 19, further comprising disposing a sealant along a contact between the IO enclosure and the chassis body.

21. The method of claim 19, further comprising forming the IO enclosure by attaching a cover to an enclosure body, wherein the cover, when detached from the enclosure, facilitates an access to the IO unit for the cabling.

* * * * *